(12) United States Patent
Ikeda et al.

(10) Patent No.: US 7,211,857 B2
(45) Date of Patent: May 1, 2007

(54) NON-VOLATILE SEMICONDUCTOR MEMORY DEVICE

(75) Inventors: Yoshihiro Ikeda, Tokyo (JP); Hiroshi Ishida, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 18 days.

(21) Appl. No.: 11/257,020

(22) Filed: Oct. 25, 2005

(65) Prior Publication Data
US 2006/0104118 A1   May 18, 2006

(30) Foreign Application Priority Data
Oct. 28, 2004   (JP)   ............... 2004-314069

(51) Int. Cl.
*H01L 29/788* (2006.01)
(52) U.S. Cl. ............... 257/316; 257/319; 257/E21.68; 365/185.22
(58) Field of Classification Search ............ 257/314, 257/315, 316, 317, 318, 319, 321, 324
See application file for complete search history.

(56) References Cited

U.S. PATENT DOCUMENTS 6,878,988 B1 *   4/2005   Lee et al.   ............ 257/324

FOREIGN PATENT DOCUMENTS

| JP | 2000-188346 | 7/2000 |
|---|---|---|
| JP | 2000-269361 | 9/2000 |
| JP | 2001-044395 | 2/2001 |

OTHER PUBLICATIONS

Sasago et al.; "90-nm-node Multi-Level AG-AND Type Flash Memory with Cell Size of True 2 $F^2$/bit and Programming Throughput of 10 MB/s"; *Technical Digest of International Electron Devices Meeting*: c. 2003; pp. 34.2.1-34.2.4; IEEE Catalog No. 03CH37457.

* cited by examiner

*Primary Examiner*—Andy Huynh
*Assistant Examiner*—Thinh T Nguyen
(74) *Attorney, Agent, or Firm*—McDermott Will & Emery LLP

(57) ABSTRACT

A non-volatile semiconductor memory device includes a semiconductor substrate, an insulating film formed on the semiconductor substrate, a plurality of memory cells formed on the semiconductor substrate, a plurality of first assist gates extending toward the memory cell, a connection portion connecting end portions of the first assist gates, a second assist gate extending toward the memory cell, a first select transistor controlling whether to apply a voltage to an area under the first assist gate, a second select transistor controlling whether to apply a voltage to an area under the second assist gate, and an impurity region. The insulating film formed under an intersection area of the connection portion and the impurity region has a thickness larger than the insulating film formed under the first and second assist gates. A non-volatile semiconductor memory device capable of ensuring a writing speed as well as reliability can thus be obtained.

8 Claims, 8 Drawing Sheets

NON-VOLATILE SEMICONDUCTOR MEMORY DEVICE

BACKGROUND OF THE INVENTION

1. Field of the Invention

The present invention relates to a non-volatile semiconductor memory device, and more particularly to a non-volatile semiconductor memory device including an assist gate.

2. Description of the Background Art

Various attempts have conventionally been made in order to reduce a size of a non-volatile semiconductor memory device (see Japanese Patent Laying-Open No. 2000-188346). An AG-AND type flash memory has been proposed as a technique to make smaller a non-volatile semiconductor memory device. In the AG-AND type flash memory, a bit line of a memory cell transistor is implemented not by a diffusion layer but by an inversion layer formed on a main surface of a semiconductor substrate when a voltage is applied to an assist gate. Accordingly, as it is not necessary to form an impurity region for forming a bit line in a memory cell area, the non-volatile semiconductor memory device can be reduced in size. Such a technique is described, for example, in Y. Sasago, et. al., "90-nm-node multi-level AG-AND type flash memory with cell size of true 2 F²/bit and programming throughput of 10 MB/s," IEDM Tech. Dig., (2003) p. 823.

The AG-AND type flash memory has a semiconductor substrate and an insulating film formed on the semiconductor substrate, and includes a memory cell area and a peripheral circuit area adjacent to the memory cell area. The memory cell area includes a floating gate and a control gate arranged on an upper surface of the floating gate, and a plurality of memory cells are formed in the memory cell area.

The peripheral circuit area includes a plurality of assist gates formed on the insulating film and an electrode portion applying a voltage to a lower surface of the assist gate.

In the conventional AG-AND type flash memory structured as above, at the time of writing, a voltage is applied to one assist gate to form an inversion layer under the assist gate, to which a voltage is applied. Then, a voltage is applied to the other assist gate to form an inversion layer under this assist gate, to which a voltage is applied. Accordingly, a write current is generated under the floating gate, so that data is written in the floating gate arranged between two assist gates. A reading operation and an erasing operation are performed also by applying voltages of various magnitudes to the assist gates.

During the reading operation or the like, voltages applied to respective assist gates and the inversion layer are different in magnitude. Therefore, depending on each operation and position, magnitude of the voltage applied to the insulating film formed under the assist gate or the like is considerably different. Meanwhile, the insulating film formed on the semiconductor substrate has a uniform thickness.

An example of a non-volatile semiconductor memory device having a gate insulating film different in thickness from a position to a position formed on a semiconductor substrate is described in Japanese Patent Laying-Open No. 2001-044395. The non-volatile semiconductor memory device includes a semiconductor substrate, a gate insulating film formed on the semiconductor substrate, a memory cell transistor formed on the gate insulating film within the memory cell, and a select transistor. The gate insulating film of the select transistor has a thickness larger than that of a tunneling insulating film of the memory cell transistor. According to this non-volatile semiconductor memory device, an operation speed of the select transistor can be improved.

In addition, an example of a non-volatile semiconductor memory device having a gate insulating film different in thickness from a position to a position formed on a semiconductor substrate is described in Japanese Patent Laying-Open No. 2000-269361.

The non-volatile semiconductor memory device has a memory cell including a memory cell transistor and a select transistor. The memory cell transistor and the select transistor are different from each other in a film thickness and a threshold voltage.

In the conventional AG-AND type flash memory, a high voltage is applied to a part of the insulating film during various operations, with the result that reliability has not been ensured. In particular during the writing operation, as a voltage larger than in other type of operation is applied to each assist gate, a large voltage is applied to a part of the insulating film formed under the assist gate, which results in difficulty in achieving ensured reliability.

If a thickness of the insulating film is set using a position to which a high voltage is applied as a reference, a writing speed is disadvantageously lowered.

In addition, none of the inventions according to Japanese Patent Laying-Open Nos. 2001-044395 and 2000-269361 is directed to ensuring reliability of the insulating film, nor related to an AG-AND type flash memory.

SUMMARY OF THE INVENTION

The present invention was made in view of the problems described above. An object of the present invention is to provide a non-volatile semiconductor memory device capable of ensuring a writing speed while improving reliability thereof.

A semiconductor memory device according to the present invention includes: a semiconductor substrate; an insulating film formed on the semiconductor substrate; a plurality of memory cells formed on the semiconductor substrate; a plurality of first assist gates formed on the insulating film and extending toward the memory cell; a connection portion connecting end portions of the first assist gates and formed on the insulating film; a second assist gate arranged on a side of said memory cell relative to said connection portion and extending low and said memory cell; a first select transistor controlling whether to apply a voltage to an area under the first assist gate; a second select transistor controlling whether to apply a voltage to an area under the second assist gate; and an impurity region formed between the second assist gate and the second select transistor. The insulating film formed under an intersection area of the connection portion and the impurity region has a thickness larger than the insulating film formed under the first assist gate and the second assist gate.

According to the present invention, a portion in the insulating film where a largest voltage is generated can have a larger thickness, so that the writing speed can be ensured while reliability of the non-volatile semiconductor memory device is ensured.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention will be described with reference to FIGS. 1 to 16.

(First Embodiment)

Figure 1:
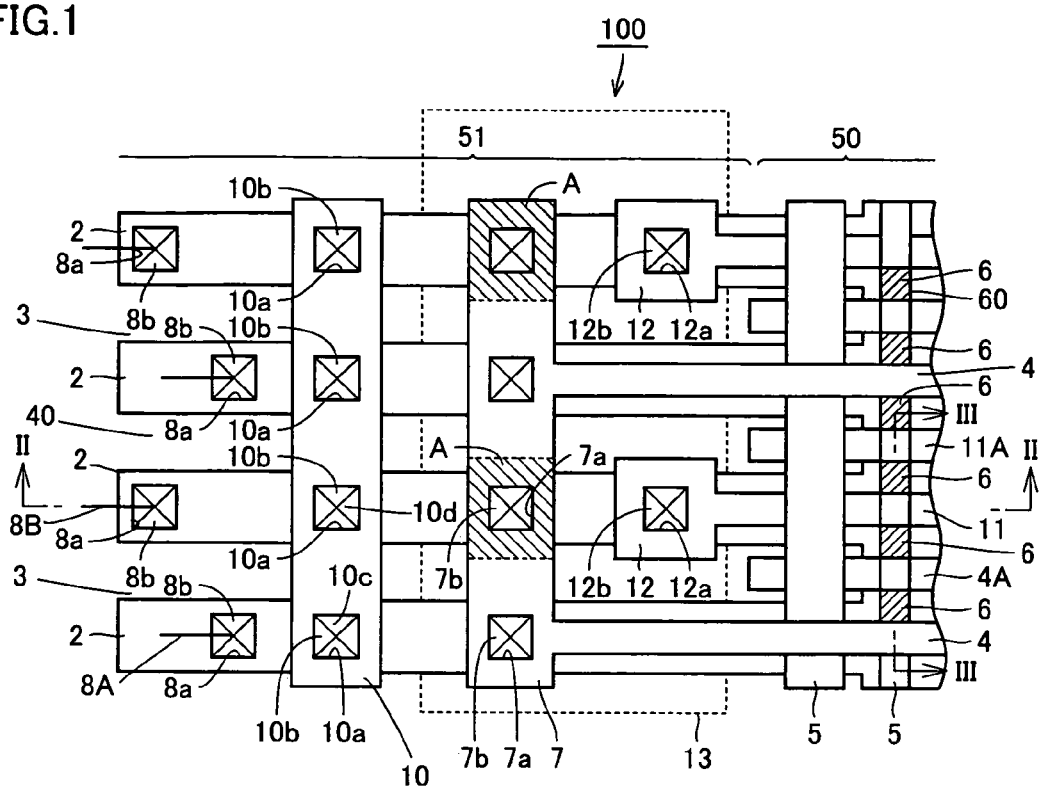
FIG. 1 is a plan view of an AG-AND type flash memory according to a first embodiment.

FIG. 1 is a plan view of an AG-AND type flash memory (non-volatile semiconductor memory device) according to a first embodiment.

As shown in FIG. 1, an AG-AND type flash memory 100 includes a memory cell area 50 and a peripheral circuit area 51 on a main surface of a semiconductor substrate 40.

Though FIG. 1 shows memory cell area 50 and peripheral circuit area 51, a not-shown peripheral circuit area structured similarly to peripheral circuit area 51 is also formed on a side opposite to peripheral circuit area 51, with memory cell area 50 lying therebetween. On the main surface of semiconductor substrate 40, a plurality of isolation regions 3 shaped like bands and active regions 2 formed between isolation regions 3 are formed from peripheral circuit area 51 toward memory cell area 50.

Active region 2 refers to an area where a device is formed, while isolation region 3 refers to a trench-shaped isolation region, for example, called STI (Shallow Trench Isolation) or SGI (Shallow Groove Isolation). That is, isolation region 3 is formed in such a manner that an insulating film composed, for example, of silicon oxide ($SiO_2$) fills the trench portion formed in the main surface of semiconductor substrate 40.

Isolation region 3 is formed in a manner extending from peripheral circuit area 51 toward memory cell area 50, and an end portion of isolation region 3 is located around an end portion of memory cell area 50. Namely, active region 2 is formed on a substantially entire surface of the semiconductor substrate around the central portion of memory cell area 50.

Peripheral circuit area 51 includes a plurality of first assist gates 4 extending toward a plurality of memory cells 6 formed in memory cell area 50, a connection portion 7 connecting end portions of first assist gates 4 on a side of peripheral circuit area 51, a second assist gate 11 arranged on a side of memory cell 6 relative to connection portion 7 and extending toward memory cell area 6, a first select transistor 10c controlling whether to apply a voltage to a first inversion layer formed in an area under first assist gate 4, a second select transistor 10d controlling whether to apply a voltage to a second inversion layer formed in an area under the second assist gate, and an impurity region formed between second assist gate 11 and second select transistor 10d.

Connection portion 7 extends in a direction intersecting a direction in which first assist gate 4 extends, that is, extends in a direction orthogonal to first assist gate 4. In addition, first assist gates 4 are connected to connection portion 7 at regular intervals.

First assist gate 4 is formed on active region 2, and has a width, for example, of approximately 65 nm. A contact 7b is formed at each portion where first assist gate 4 is connected to connection portion 7. Contact 7b includes a contact hole 7a and a plug formed in contact hole 7a.

Second assist gate 11 is arranged on a side of memory cell area 50 relative to connection portion 7, and extends from the side of peripheral circuit area 51 toward memory cell area 50. A large-width area 12 is formed at an end of second assist gate 11 on the side of peripheral circuit area 51, and arranged on the side of memory cell area 50 relative to connection portion 7. A contact 12b that includes a contact hole 12a and a plug formed in contact hole 12a is formed in large-width area 12.

A connection portion 10 is arranged on the side of peripheral circuit area 51 relative to connection portion 7. Connection portion 10 extends in a direction intersecting a direction in which first and second assist gates 4, 11 extend, for example, in a direction orthogonal to first assist gate 4 and second assist gate 11. In addition, first and second select transistors 10c and 10d are formed at respective intersections of connection portion 10 and active regions 2. Moreover, contacts 10b communicating to gate electrodes of first and second select transistors 10c, 10d are formed at respective intersections of connection portion 10 and active regions 2. Contact 10b includes a contact hole 10a and a plug formed in contact hole 10a.

First select transistor 10c and first assist gate 4 are formed on the same band-shaped active region 2. Second select transistor 10d and second assist gate 11 are formed on the same band-shaped active region 2.

A contact 8b formed on band-shaped active region 2 is formed on the side of peripheral circuit area 51 relative to connection portion 10. Contact 8b includes a contact hole 8a and a plug formed in contact hole 8a. The plug is connected to global bit lines 8A, 8B to which a voltage is applied.

In memory cell area 50, first assist gate 4, second assist gate 11, a third assist gate 4A, a fourth assist gate 11A, and a plurality of word lines 5 extending in a direction substantially orthogonal to first, second, third, and fourth assist gates 4, 11, 4A, and 11A are provided, thus forming memory cells 6 arranged in matrix.

Third assist gate 4A and fourth assist gate 11A extend from the not-shown peripheral circuit area, arranged opposite to peripheral circuit area 51 with memory cell area 50 lying therebetween, toward peripheral circuit area 50.

In addition, third assist gate 4A and fourth assist gate 11A are arranged in parallel to first and second assist gates 4, 11. Tip end portions of third assist gate 4A and fourth assist gate 11A are located at the end of memory cell area 50 on the side of peripheral circuit area 51. Third assist gate 4A is arranged between first assist gate 4 and second assist gate 11, and the end portions of third assist gate 4A are connected by a not-shown connection portion, in a manner similar to first assist gate electrode 4. Fourth assist gate 11A is arranged to sandwich second assist gate 11 together with third assist gate 4A. It is noted that tip end portions of first assist gate 4 and second assist gate 11 are located at the end of memory cell area 50 on a side of the not-shown peripheral circuit area.

Memory cell 6 includes an insulating film formed on semiconductor substrate 40, word line 5, and a floating gate 60 arranged on a lower surface of word line 5. Floating gate 60 is arranged in an area sandwiched by first assist gate 4 and third assist gate 4A, an area sandwiched by third assist gate 4A and second assist gate 11, and an area sandwiched by second assist gate 11 and fourth assist gate 11A, out of the area under word line 5. Therefore, memory cells 6 are arranged in matrix on semiconductor substrate 40.

Figure 2:
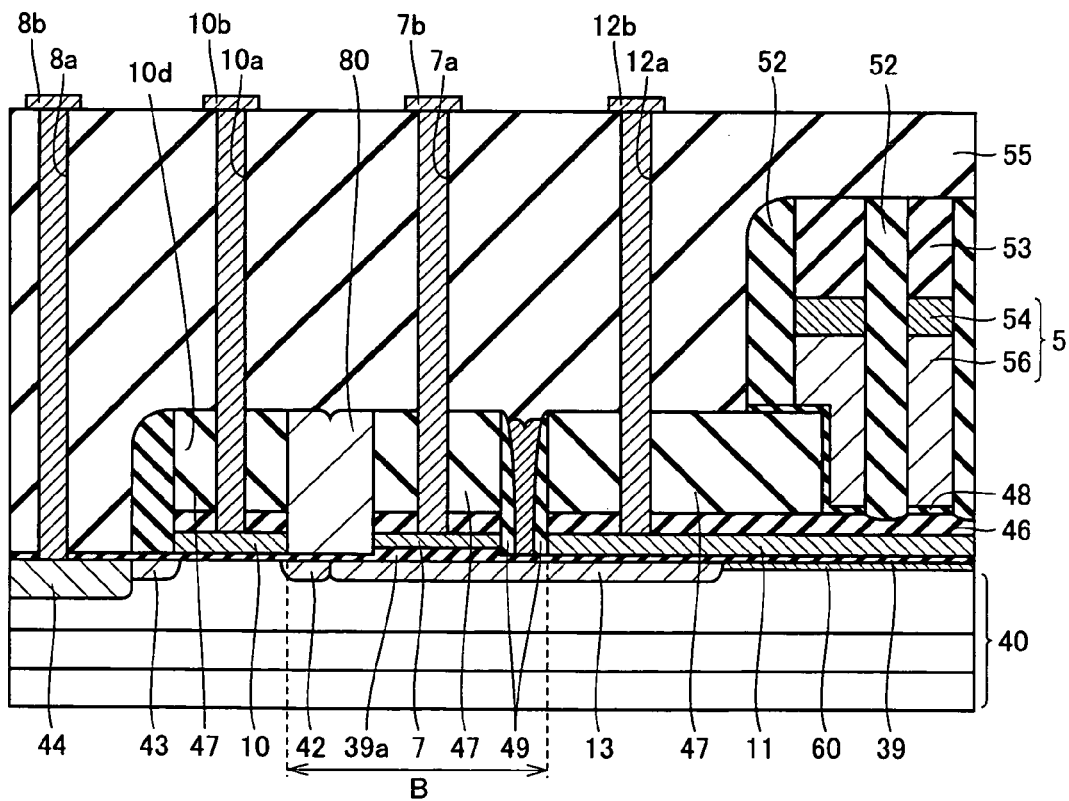
FIG. 2 is a cross-sectional view along the line II—II of the AG-AND type flash memory shown in FIG. 1.

FIG. 2 is a cross-sectional view along the line II—II in FIG. 1. As shown in FIG. 2, semiconductor substrate 40 is implemented, for example, by P-type silicon (Si) monocrystal, and has a P-type well and an n-type embedded region formed. For example, boron (B) is introduced in the P-type well, of which outer circumference (side surface and bottom surface) is surrounded by the n-type embedded region. For example, phosphorus (P) is introduced in the n-type embedded region.

As shown in FIG. 2, an insulating film 39 is formed on a substantially entire upper surface of semiconductor substrate 40. On the upper surface of insulating film 39, connection portion 10, connection portion 7 and second assist gate 11 are formed. In addition, an insulating film 80 is formed between connection portion 10 and connection portion 7, and a sidewall 49 is formed between connection portion 7 and second assist gate 11. Connection portion 10, connection portion 7 and second assist gate 11 are formed from polycrystalline silicon attaining low resistance, and a thickness thereof is set, for example, to approximately 50 nm. Moreover, a cap insulating film 46 is formed on each upper surface of connection portion 10, connection portion 7 and second assist gate 11. Cap insulating film 46 is formed, for example, from silicon nitride, and has a thickness, for example, of approximately 70 nm. An insulating film 47 composed, for example, of silicon oxide is formed on the upper surface of cap insulating film 46. An insulating film 55 is formed on the upper surface of insulating film 47.

Contact hole 10a is formed to penetrate insulating films 47, 55 and cap insulating film 46, and a lower end portion of contact 10b is connected to connection portion 10. In addition, contact hole 7a is formed to penetrate insulating films 47, 55 and cap insulating film 46, and a lower end portion of contact 7b is connected to connection portion 7. Contact hole 12a is formed to penetrate insulating films 47, 55 and cap insulating film 46, and a lower end portion of contact 12b is connected to second assist gate 11.

Out of the main surfaces of semiconductor substrate 40, n$^-$ type semiconductor regions 42, 43 are formed around respective side surfaces of connection portion 10. N$^-$ type semiconductor region 43 is formed around the side surface of connection portion 10 on peripheral circuit area 51 side, while n$^-$ type semiconductor region 42 is formed around the side surface of connection portion 10 on memory cell area 50 side. An n$^+$ type semiconductor region 44 is formed adjacent to n$^-$ type semiconductor region 43 on the main surface of semiconductor substrate 40. N$^+$ type semiconductor region 44 is formed to attain a concentration higher than n$^-$ type semiconductor region 42. Semiconductor region 44 is connected to the lower end portion of contact 8b, and a voltage is applied to semiconductor region 44 by global bit lines 8A, 8B through contact 8b.

An n$^-$ type semiconductor region 13 is formed closer to the memory cell relative to semiconductor region 42. One end portion of semiconductor region 13 is located on the side of peripheral circuit area 51 relative to connection portion 7, and the other end thereof is located on the lower surface side of second assist gate 11.

Accordingly, semiconductor region 42 and semiconductor region 13 are formed on a lower surface of an area B lying between second select transistor 10d and the end portion of second assist gate 11 on the side of peripheral circuit area 51. In FIGS. 1 and 2, insulating film 39 formed under an intersection area A of the impurity region formed within area B and connection portion 7 has a thickness larger than insulating film 39 formed under first assist gate 4 and second assist gate 11. That is, insulating film 39 formed under first assist gate 4 and second assist gate 11 has a thickness of approximately 9 nm, whereas insulating film 39 formed under intersection area A shown as a hatched portion in FIG. 1 has a thickness in a range from at least 13 nm to at most 33 nm. A large-thickness portion 39a is thus formed under intersection area A.

If large-thickness portion 39a has a thickness smaller than 13 nm, it is likely that large-thickness portion 39a cannot withstand the voltage applied thereto at the time of writing of data in memory cell 6, which results in difficulty in achieving ensured reliability.

Meanwhile, if large-thickness portion 39a has a thickness larger than 33 nm, large-thickness portion 39a projects relative to a surrounding portion. In such a case, it becomes difficult to form connection portion 7 or the like which is to be formed on the upper surface of large-thickness portion 39a, and a manufacturing process becomes complicated. The thickness of large-thickness portion 39a is set depending on magnitude of a voltage applied thereto at the time of writing. For example, if a voltage of 8V is applied to large-thickness portion 39a, a thickness of large-thickness portion 39a is set to approximately 13 nm. A plurality of word lines 5 are formed in memory cell area 50, and an insulating film 52 is formed between word lines 5.

Intersection area A refers to an area where active region 2 in which second assist gate 11 is formed two-dimensionally intersects with connection portion 7. Namely, intersection area A refers to an area in connection portion 7, around contact hole 7a located between coupling portions where first assist gates 4 are coupled to connection portion 7.

Figure 3:
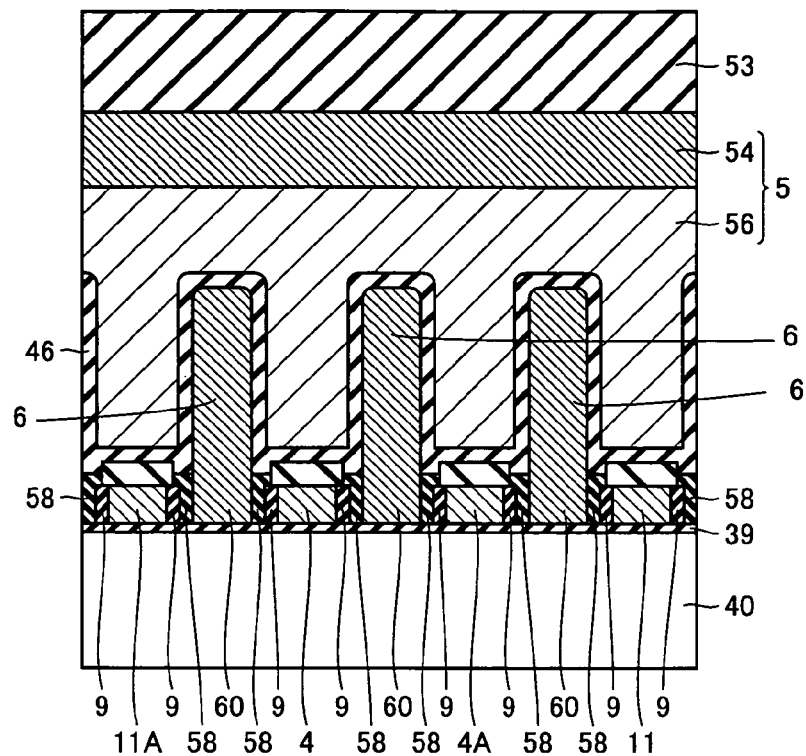
FIG. 3 is a cross-sectional view along the line III—III of the AG-AND type flash memory shown in FIG. 1.

FIG. 3 is a cross-sectional view along the line III—III in FIG. 1. As shown in FIG. 3, insulating film 39 formed on the upper surface of semiconductor substrate 40, first assist gate 4, second assist gate 11, third assist gate 4A, fourth assist gate 11A, floating gate 60 arranged between the assist gates and formed on insulating film 39, and word line 5 attaining a function as a control gate formed on the upper surface of floating gate 60 are formed. Insulating film 46 is formed on the upper surface of floating gate 60, and word line 5 is formed on insulating film 46. Insulating film 46 is formed, for example, by successively stacking silicon oxide, silicon nitride and silicon oxide. That is, insulating film 46 is implemented by what is called an ONO film.

Word line 5 is constituted, for example, of a conductive film 56 implemented by polycrystalline silicon attaining low resistance and a high-melting silicide film 54 implemented by tungsten silicide ($WSi_x$) or the like formed on conductive film 56. For example, an insulating film 53 implemented by silicon oxide is formed on word line 5.

Memory cell 6 includes insulating film 39, floating gate 60 formed on the upper surface of insulating film 39, and word line 5 formed on the upper surface of floating gate 60. Floating gate 60 represents a layer for accumulating charges of data, formed in a columnar shape, for example, from polycrystalline silicon attaining low resistance. An insulating film 9 and an insulating film 58 are formed between each floating gate 60 and each first, second, third, and fourth assist gate 4, 11, 4A, and 11A, so as to achieve insulation. An area formed on the lower surface of floating gate 60 out of insulating film 39 attains a function as a tunneling insulating film. A thickness of insulating film 39 formed on the lower surface of floating gate 60 is set, for example, to approximately 9 nm.

Figure 4:
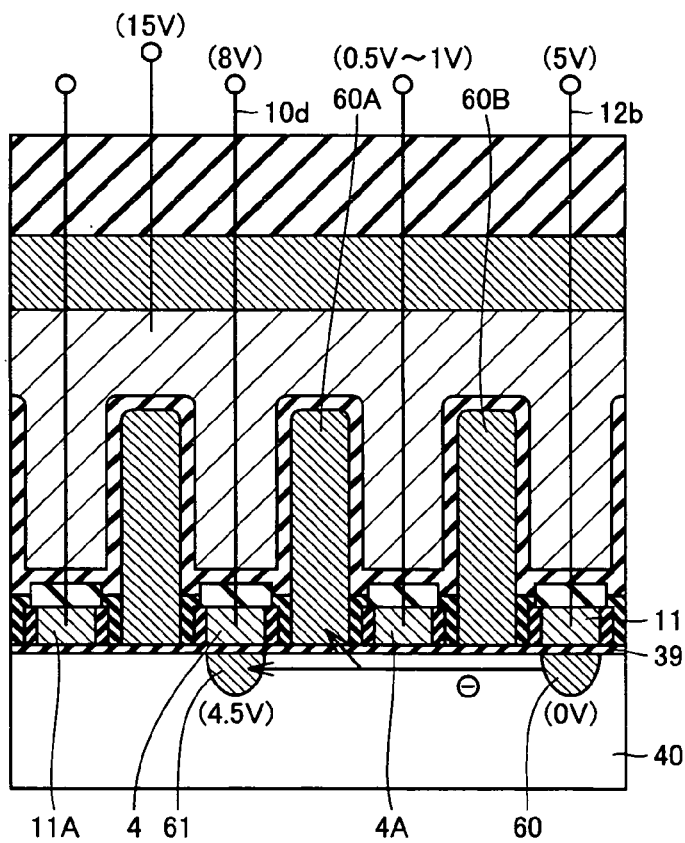
FIG. 4 is a cross-sectional view of an AG-AND type flash memory 100 shown in FIG. 1 in a writing operation.

FIG. 4 is a cross-sectional view of AG-AND type flash memory 100 structured as above in a writing operation. As shown in FIG. 4, a voltage of approximately 8V is applied to first assist gate 4, and a voltage of approximately 5V is applied to second assist gate 11. A voltage in a range approximately from at least 0.5V to at most 1.0V is applied to third assist gate 4A arranged between first assist gate 4 and second assist gate 11. In addition, a voltage of approximately 15V is applied to selected word line 5.

Here, an inversion layer 60 is formed in an area under second assist gate 11, and an inversion layer 61 is formed in an area under first assist gate 4. In FIG. 1, a voltage of approximately 4.5V is applied to global bit line 8A, and a voltage of approximately 0V is applied to global bit line 8B.

Second select transistor 10d applies or stops to apply a voltage from global bit line 8B to inversion layer 60 formed in the area under second assist gate 11, as a result of turn-on and off thereof. Meanwhile, first select transistor 10c applies or stops to apply a voltage from global bit line 8A to inversion layer 61 formed in the area under first assist gate 4, as a result of turn-on and off thereof. Here, first select transistor 10c and second select transistor 10d enter ON state.

Accordingly, in FIG. 4, a voltage of approximately 0V is applied to formed inversion layer 60, and a voltage of approximately 4.5V is applied to inversion layer 61. Then, electrons flow from inversion layer 60 to inversion layer 61. Here, electrons enter a floating gate 60A arranged on first assist gate 4 side out of floating gates 60A and 60B arranged between first and second assist gates 4 and 11, whereby data is written.

Referring to FIG. 2, second select transistor 10d is in ON state, and a voltage of approximately 0V is applied to global bit line 8B connected a plug 8b. Therefore, a voltage of approximately 0V is applied to semiconductor regions 13, 42, 43, and 44. Meanwhile, a voltage of approximately 8V is applied to connection portion 7. That is, in intersection area A shown in FIGS. 1 and 2, a voltage of 8V is applied to connection portion 7, while a voltage of approximately 0V is applied to the impurity region under intersection area A. Therefore, a voltage of approximately 8V is applied to large-thickness portion 39a formed under intersection area A. In FIG. 4, a voltage of approximately 0V is applied to inversion layer 60, while a voltage of approximately 5V is applied to second assist gate 11. Therefore, a voltage of approximately 5V is applied to insulating film 39 formed under second assist gate 11. As a voltage of approximately 4.5V is applied to inversion layer 61 and a voltage of approximately 8V is applied to first assist gate 4, a voltage of approximately 3.5V is applied to insulating film 39 formed under first assist gate 4.

Figure 5:
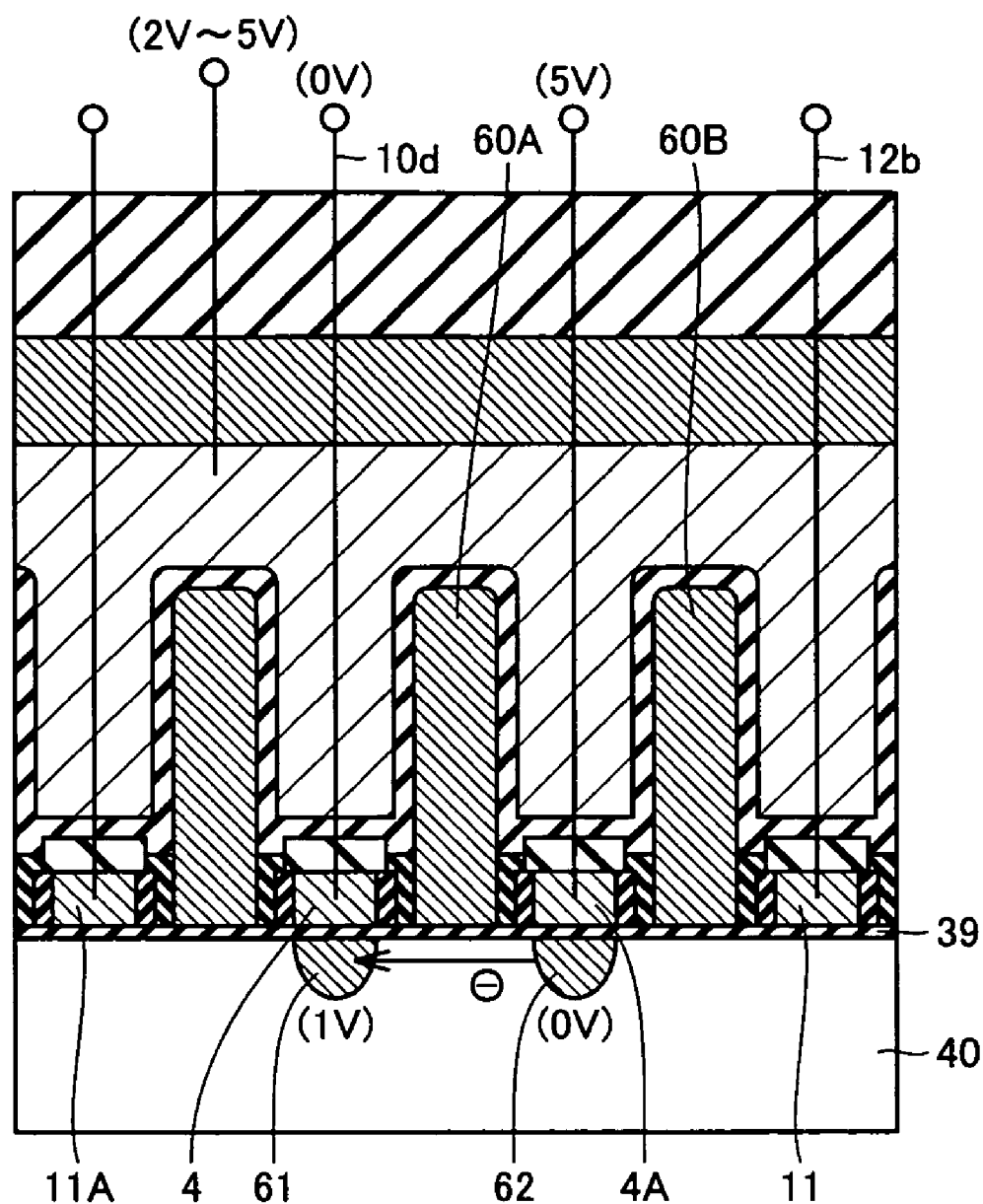
FIG. 5 is a cross-sectional view of AG-AND type flash memory 100 shown in FIG. 1 in a reading operation.

FIG. 5 is a cross-sectional view of AG-AND type flash memory 100 according to the present embodiment in a reading operation. As shown in FIG. 5, a voltage of approximately 5V is applied to third assist gate 4A, and a voltage of approximately 0V is applied to second assist gate 4. Then, a voltage of approximately 0V is applied to an inversion layer 62 formed under third assist gate 4A, and a voltage of approximately 1V is applied to inversion layer 61 formed under second assist gate 4. In addition, a voltage in a range approximately from at least 2V to at most 5V is applied to selected word line 5. Here, depending of a charged state of floating gate 60A, a threshold voltage of the selected memory cell is varied. Therefore, data accumulated in selected memory cell 6 can be determined based on a state of a current that flows between inversion layer 61 and inversion layer 62.

During the reading operation, a voltage of approximately 1V is applied to insulating film 39 formed under first assist gate 4, and a voltage of approximately 5V is applied to insulating film 39 formed under third assist gate 4A.

A voltage of approximately 0V is applied to connection portion 7 in intersection area A, and a voltage of approximately 0V is applied to the impurity region in intersection area A. Therefore, a voltage of approximately 0V is applied to large-thickness portion 39a formed under intersection area A.

Figure 6:
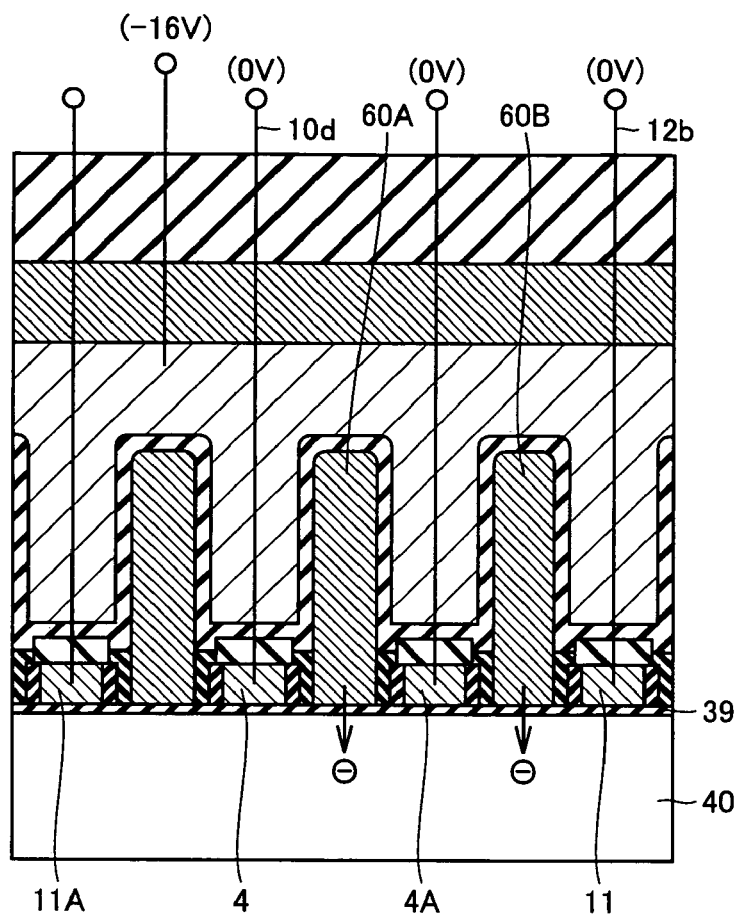
FIG. 6 is a cross-sectional view of AG-AND type flash memory 100 shown in FIG. 1 in data erasing.

FIG. 6 is a cross-sectional view of AG-AND type flash memory 100 according to the present embodiment in data erasing. As shown in FIG. 6, for example, a voltage of approximately −16V is applied to selected word line 5. Then, a positive voltage is applied to semiconductor substrate 40, and a voltage, for example, of approximately 0V is applied to first, second, third, and fourth assist gates 4, 4A, 11, and 11A. Here, an inversion layer is not formed. Accordingly, charges of data accumulated in floating gate 60 are released to semiconductor substrate 40 through insulating film 39, to erase the data in the plurality of memory cells. An arrow in FIG. 6 schematically shows a manner of release of the charges. In such an erasing operation, a voltage applied to insulating film 39 located under first, second, third, and fourth assist gates 4, 11, 4A, and 11A is substantially equal to a voltage applied to large-thickness portion 39a. Namely, the voltage applied to semiconductor substrate 40 is applied.

As described above, it is large-thickness portion 39a formed under intersection area A at the time of the writing operation that the highest voltage is applied to throughout the writing operation, the reading operation and the erasing operation.

Figure 7:
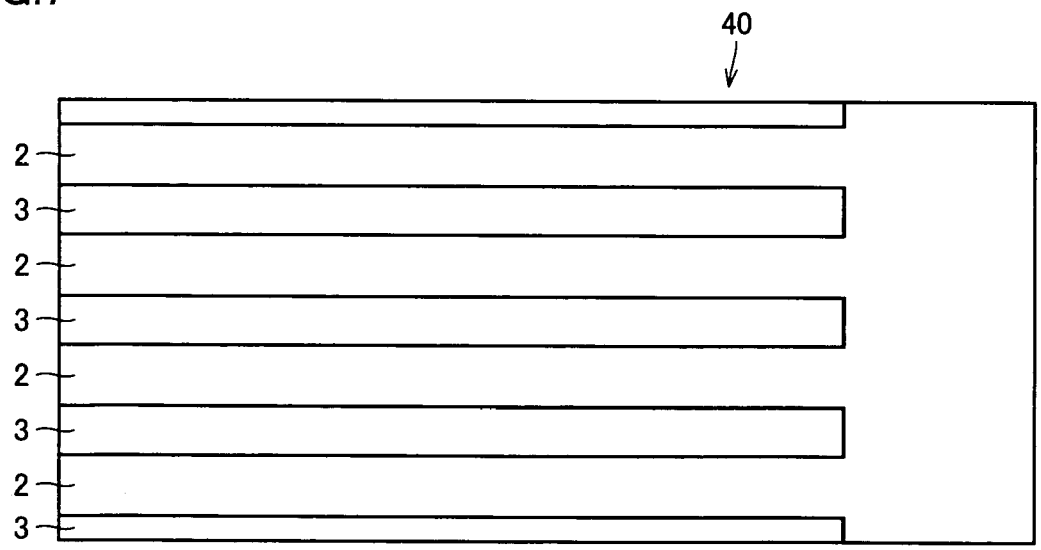
FIG. 7 is a plan view after the step of forming an active region and an isolation region.
Figure 8:
FIG. 8 is a cross-sectional view after the step of forming the active region and the isolation region.

FIGS. 7 to 12 show the steps of manufacturing AG-AND type flash memory 100 structured as above. FIGS. 7 and 8 are a plan view and a cross-sectional view after the step of forming active region 2 and isolation region 3, respectively. As shown in FIGS. 7 and 8, initially, a trench portion is formed on the main surface of semiconductor substrate 40, and the trench portion is filled with an insulating film composed, for example, of silicon oxide, so as to form isolation region 3.

Figure 9:
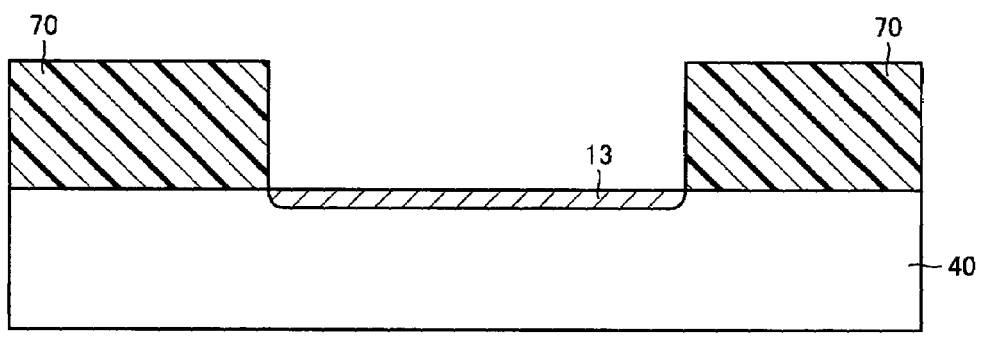
FIG. 9 is a cross-sectional view showing the step of forming a semiconductor region.

FIG. 9 is a cross-sectional view showing the step of forming semiconductor region 13. As shown in FIG. 9, a photoresist pattern 70 is formed to cover an area other than semiconductor region 13 to be formed. Then, using photoresist pattern 70 as a mask, for example, arsenic is introduced into semiconductor substrate 40 with an ion implantation method or the like.

Figure 10:
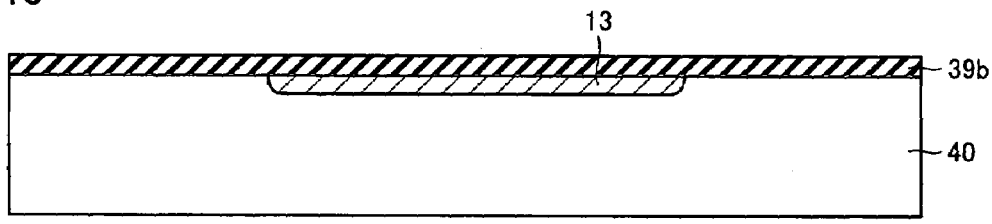
FIG. 10 is a cross-sectional view showing a first step in the step of forming an insulating film.

FIG. 10 is a cross-sectional view showing a first step in the step of forming the insulating film. As shown in FIG. 10, for example, the insulating film composed of silicon oxide is formed on the main surface of the semiconductor substrate to a thickness of approximately 22 nm with a thermal oxidation method such as ISSG (In-Situ Steam Generation) oxidation. If a dual gate process is employed in peripheral circuit area 51, the first step of forming the insulating film can be performed simultaneously with other step. A thickness of the insulating film formed in this step is set to a value slightly smaller than a thickness of large-thickness portion 39a to be formed.

Figure 11:
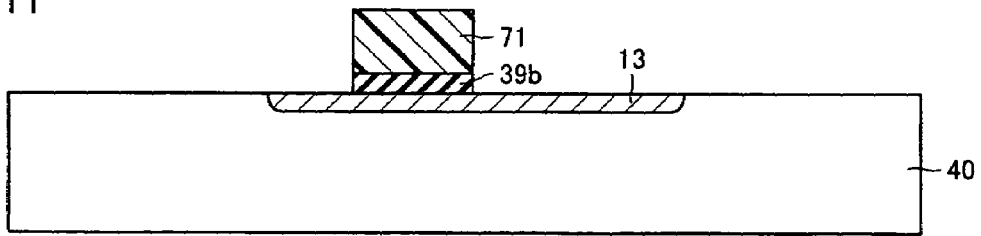
FIG. 11 is a cross-sectional view showing a second step in the step of forming the insulating film.

FIG. 11 is a cross-sectional view showing a second step in the step of forming the insulating film. As shown in FIG. 11, a photoresist pattern 71 is formed in a portion serving as intersection area A. Using photoresist pattern 71 as a mask, etching is performed using hydrofluoric acid. Thereafter, photoresist pattern 71 is removed, for example, by using sulfuric acid.

Figure 12:
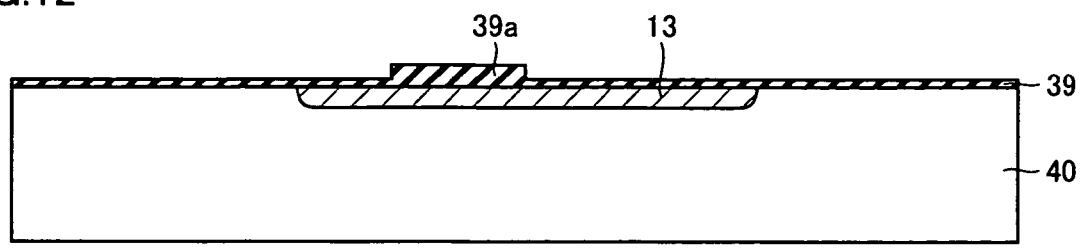
FIG. 12 is a cross-sectional view showing a third step in the step of forming the insulating film.

FIG. 12 is a cross-sectional view showing a third step in the step of forming the insulating film. As shown in FIG. 12, after photoresist pattern 71 is removed, the main surface of semiconductor substrate 40 is oxidized so as to attain a thickness, for example, of approximately 9 nm.

In this manner, large-thickness portion 39a having a thickness of approximately 25 nm is formed in the portion serving as intersection area A, and insulating film 39 having a thickness, for example, of approximately 9 nm is formed on other main surface of semiconductor substrate 40. After undergoing various steps, AG-AND type flash memory 100 is formed.

In AG-AND type flash memory 100 described above, large-thickness portion 39a is formed under intersection area A to which the highest voltage is applied throughout the writing operation, the reading operation and the erasing operation. Therefore, a property to withstand a voltage as well as reliability and performance of AG-AND type flash memory 100 can be ensured. Specifically, even if a voltage of approximately 8V is applied to the portion serving as intersection area A during the writing operation, the property to withstand a voltage is ensured, because large-thickness portion 39a has a thickness in a range from at least 13 nm to at most 33 nm.

If the step of forming large-thickness portion 39a is incorporated in other step, addition of a step is avoided, and reliability of AG-AND type flash memory 100 can be improved without cost increase. In addition, penetration of contact hole 7a as far as semiconductor substrate 40 at the time of forming contact hole 7a above large-thickness portion 39a can be suppressed. Specifically, if large-thickness portion 39a is present at the time of etching insulating films 55, 47 and cap insulating film 46 for forming contact hole 7a, a margin by a thickness of large-thickness portion 39a can be secured, whereby etching as far as semiconductor substrate 40 can be suppressed.

(Second Embodiment)

Figure 13:
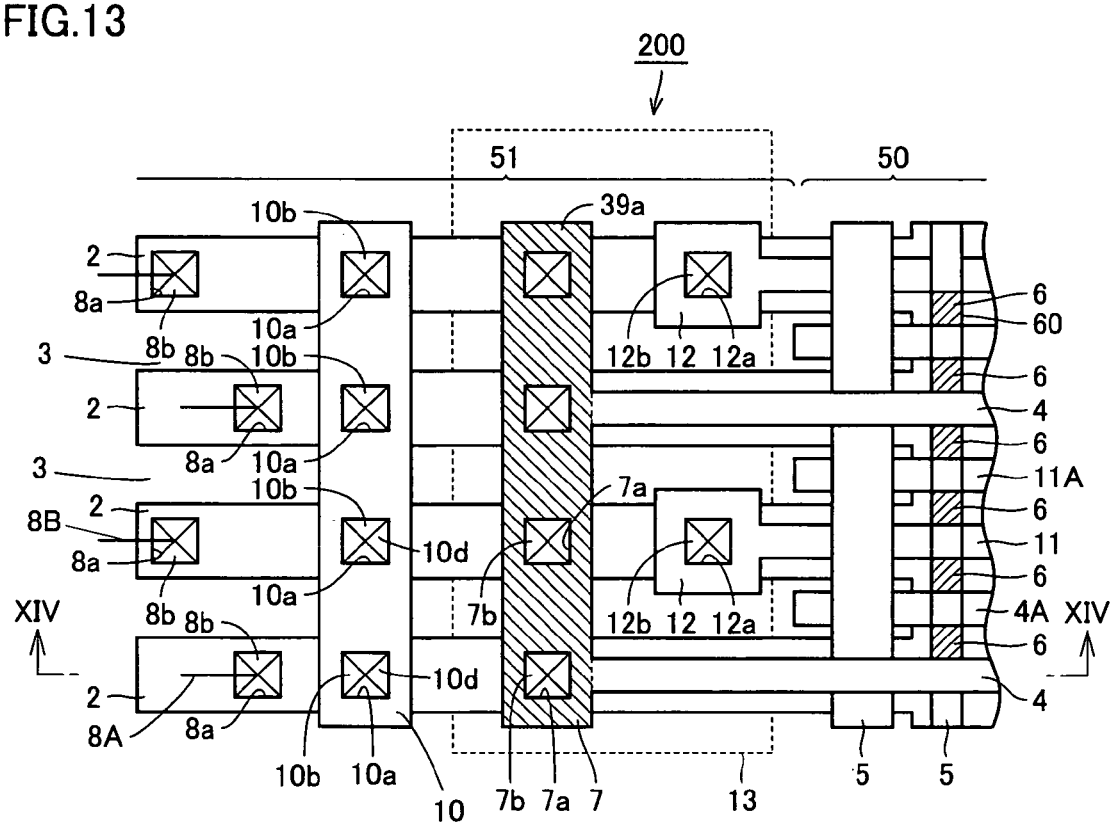
FIG. 13 is a plan view of an AG-AND type flash memory according to a second embodiment.
Figure 14:
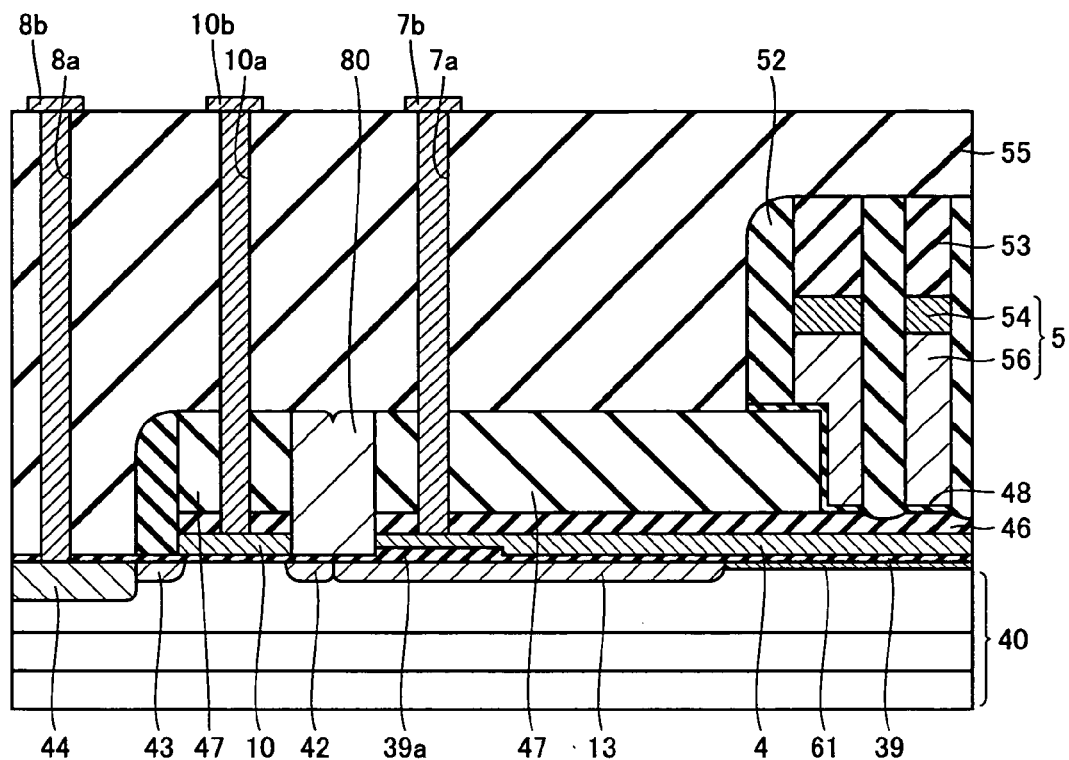
FIG. 14 is a cross-sectional view along the line XIV—XIV in FIG. 13.

A second embodiment according to the present invention will be described with reference to FIGS. 13 and 14. FIG. 13 is a plan view of an AG-AND type flash memory 200 according to the second embodiment, and FIG. 14 is a cross-sectional view along the line XIV—XIV in FIG. 13.

As shown in FIG. 13, large-thickness portion 39a is formed in an area shown as a hatched portion, on a substantially entire surface under connection portion 7. Therefore, as shown in FIG. 14, large-thickness portion 39a is formed also under a lower surface of the coupling portions of first assist gates 4 and connection portion 7.

In order to form insulating film 39 having large-thickness portion 39a formed, initially, a photoresist pattern is formed in a portion to serve as connection portion 7 in the second step of forming the insulating film. Then, using the resist pattern as a mask, the insulating film is etched. Thereafter, the photoresist pattern is removed. In the third step of forming the insulating film, the main surface of the semiconductor substrate is further oxidized, so as to form insulating film 39 having large-thickness portion 39a formed under connection portion 7. It is noted that structures other than those described above are similar to those in the first embodiment described above, and the same elements have the same reference characters allotted.

In AG-AND type flash memory 200 structured as above, large-thickness portion 39a is formed on the substantially entire surface under connection portion 7. Therefore, penetration of contact hole 7a as far as the main surface of semiconductor substrate 40 at the time of forming contact hole 7a to be formed on connection portion 7 can be suppressed.

In addition, the pattern of the photoresist used in the second step of forming the insulating film is such that solely the portion to serve as connection portion 7 is opened. Namely, the opening portion has a simple shape. The photoresist pattern can thus be formed accurately and easily, and large-thickness portion 39a can accurately be formed under connection portion 7.

In the second embodiment as well, large-thickness portion 39a is formed under intersection area A to which the highest voltage is applied throughout the writing operation, the reading operation and the erasing operation, as in the first embodiment described above. Therefore, a function and effect the same as in the first embodiment can be achieved.

(Third Embodiment)

Figure 15:
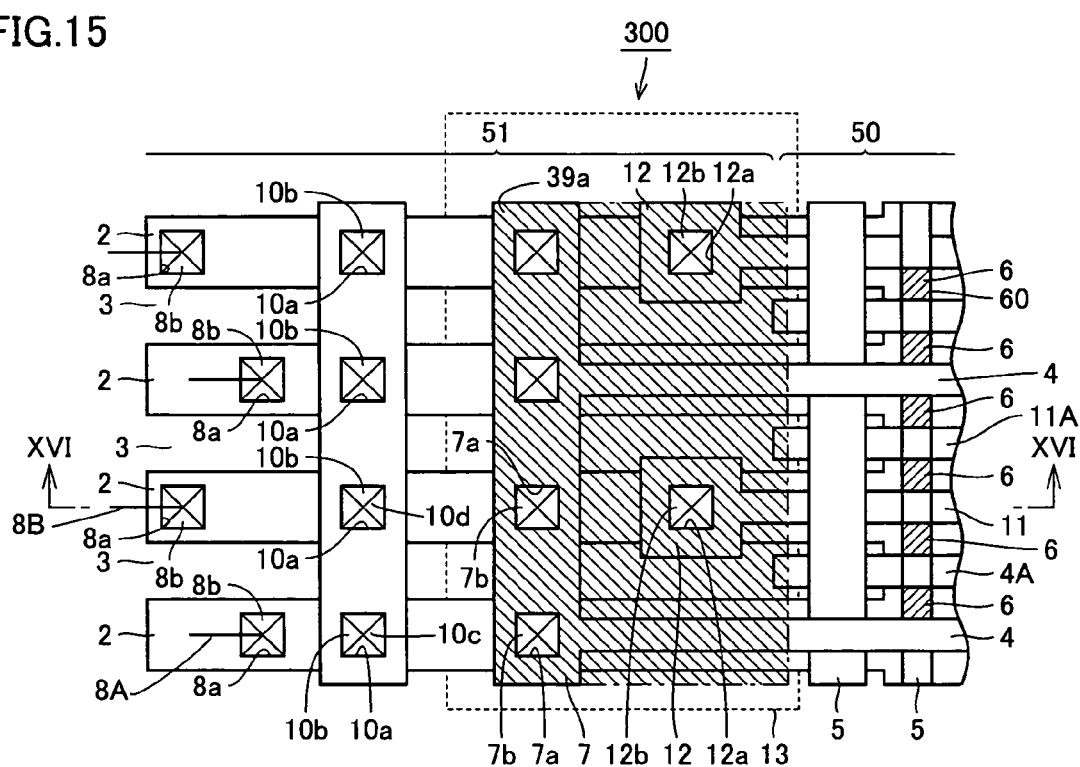
FIG. 15 is a plan view of an AG-AND type flash memory according to a third embodiment.

A third embodiment according to the present invention will be described with reference to FIGS. 15 and 16. FIG. 15 is a plan view of an AG-AND type flash memory 300 according to the third embodiment. As shown in FIG. 15, large-thickness portion 39a is formed in an area shown as a hatched portion, at least from an area under connection portion 7 toward an area under contact hole 12a. In other words, large-thickness portion 39a is formed like a substantially rectangular sheet on semiconductor substrate 40. One side of large-thickness portion 39a is located on the lower surface of connection portion 7, while the other side thereof is located on the side of memory cell area 50 relative to contact hole 12a formed on second assist gate 11.

Accordingly, large-thickness portion 39a is formed on the lower surface side of contact hole 7a and contact hole 12a. In addition, an end portion of the impurity region consisting of semiconductor region 13 and semiconductor region 42 on the memory cell 6 side is arranged closer to the memory cell 6 side relative to the end portion of large-thickness portion 39a on the memory cell 6 side.

Figure 16:
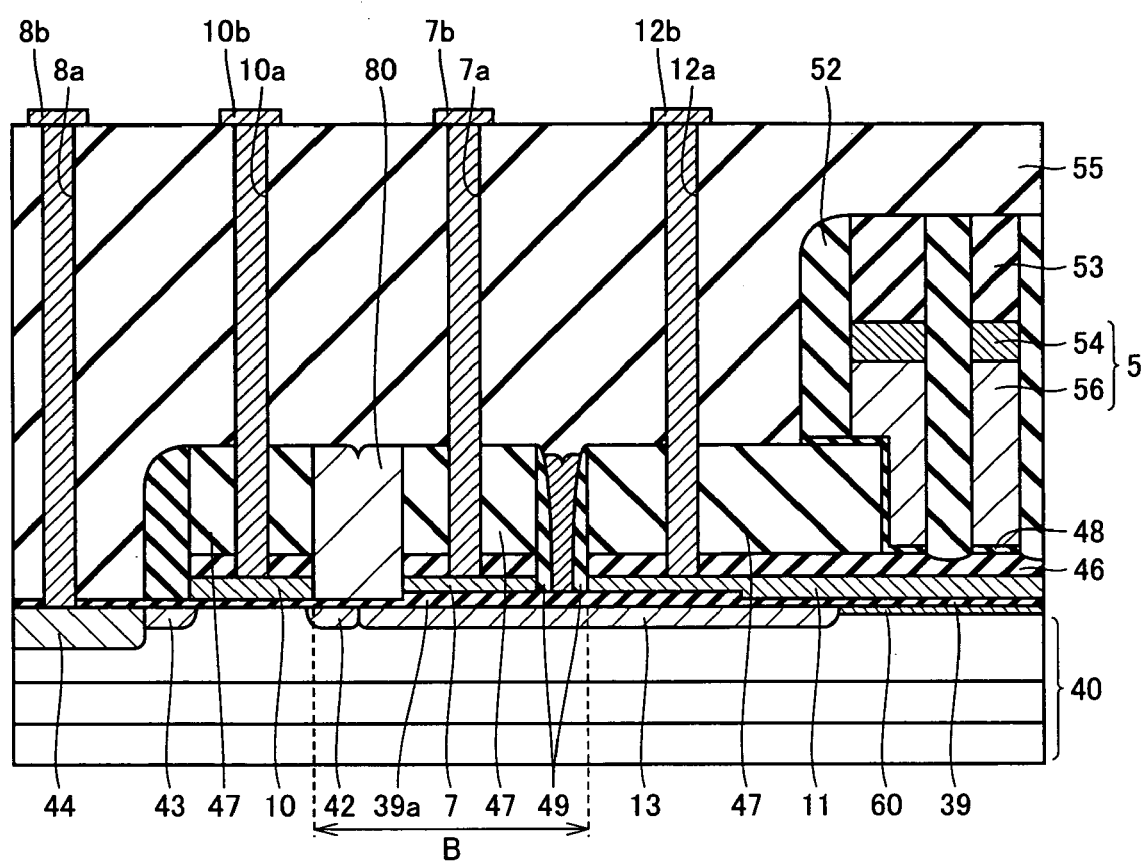
FIG. 16 is a cross-sectional view along the line XVI—XVI in FIG. 15.

FIG. 16 is a cross-sectional view along the line XVI—XVI in FIG. 15. As shown in FIG. 16, the end portion of semiconductor region 13 on memory cell 6 side is formed closer to memory cell 6 relative to large-thickness portion 39a, and the end portion of semiconductor region 13 on peripheral circuit area 51 side is located on the peripheral circuit area 51 side relative to large-thickness portion 39a. It is noted that structures other than those described above are similar to those in the first and second embodiments described above, and the same elements have the same reference characters allotted.

In AG-AND type flash memory 300, semiconductor region 13 extends toward memory cell area 50 side farther than large-thickness portion 39a. Therefore, during writing, a substrate effect coefficient K does not tend to be greater, and a voltage is applied to inversion layers 60 and 61 satisfactorily. Specifically, if the end portion of semiconductor region 13 retreats to peripheral circuit area 51 side relative to the end portion of large-thickness portion 39a, in a part of large-thickness portion 39a that projects from semiconductor region 13 toward the memory cell 6 side, substrate effect coefficient K becomes greater and lowering in a drain voltage during writing is caused.

Here, substrate effect coefficient K is expressed as $K = K_{2D} \times (1 + \delta X_{DEP0}/W)$. $K_{2D} = \sqrt{(2\epsilon_{Si} q N_A)}/C_{OX}$ represents a substrate constant in two-dimensional approximation ($W \to \infty$; when a fringe portion 5 of a depletion layer is ignored; a dashed line in FIG. 2), $X_{DEP} = \sqrt{(2\epsilon_{Si}(\phi_S - V_{bs})/qN_A)}$ represents a width of the depletion layer, $X_{DEP0}$ represents a width of the depletion layer when $V_{bs}$ (substrate bias)=0(V), $\delta$ represents a fitting parameter, $\epsilon_{Si}$ represents a dielectric constant of Si, q represents elementary charge, $q\phi_S$ represents difference in energy between Fermi level $E_F$ and intrinsic Fermi level $E_i$, $N_A$ represents an acceptor impurity concentration, and $C_{OX}$ represents a capacitance of an oxide film of an MOS transistor according to the present model. Therefore, if large-thickness portion 39a projects from semiconductor region 13 toward the memory cell 6 side, the value of $C_{OX}$ becomes smaller and substrate effect coefficient K becomes greater in the projecting part. On the other hand, AG-AND type flash memory 300 includes no part of large-thickness portion 39a projecting from semiconductor region 13, and is free from a part in which the substrate effect coefficient is large.

In AG-AND type flash memory 300 according to the third embodiment, large-thickness portion 39a is formed on the lower surface of contact hole 12a and contact hole 7a. Therefore, penetration of contact holes 7a, 12a as far as the main surface of semiconductor substrate 40 at the time of forming contact holes 7a, 12a can be suppressed. In addition, in AG-AND type flash memory 300 according to the present embodiment, substrate effect coefficient K does not tend to become greater, and therefore, a writing speed as fast as in the first and second embodiments described above can be maintained.

In AG-AND type flash memory 300 according to the third embodiment, large-thickness portion 39a is formed in intersection area A as in the first and second embodiments above. Therefore, a function and effect the same as in the first and second embodiments can be achieved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A non-volatile semiconductor memory device, comprising:
   a semiconductor substrate;
   an insulating film formed on said semiconductor substrate;
   a plurality of memory cells formed on said semiconductor substrate;
   a plurality of first assist gates formed on said insulating film and extending toward said memory cell;
   a connection portion connecting end portions of said first assist gates and formed on said insulating film;
   a second assist gate arranged on a side of said memory cell relative to said connection portion and extending toward said memory cell;
   a first select transistor controlling whether to apply a voltage to an area under said first assist gate;
   a second select transistor controlling whether to apply a voltage to an area under said second assist gate; and
   an impurity region formed between said second assist gate and said second select transistor; wherein
   said insulating film formed under an intersection area of said connection portion and said impurity region has a thickness larger than said insulating film formed under said first assist gate and said second assist gate.

2. The non-volatile semiconductor memory device according to claim 1, wherein
   said insulating film formed under said connection portion has a thickness in a range from at least 13 nm to at most 33 nm.

3. A non-volatile semiconductor memory device, comprising:
   a semiconductor substrate;
   an insulating film formed on said semiconductor substrate;
   a plurality of memory cells formed on said semiconductor substrate;
   a plurality of first assist gates formed on said insulating film and extending toward said memory cell;
   a connection portion connecting end portions of said first assist gates and formed on said insulating film;
   a second assist gate arranged on a side of said memory cell relative to said connection portion and extending toward said memory cell;
   a first select transistor controlling whether to apply a voltage to an area under said first assist gate;
   a second select transistor controlling whether to apply a voltage to an area under said second assist gate; and
   an impurity region formed between said second assist gate and said second select transistor; wherein
   said insulating film formed under said connection portion has a thickness larger than said insulating film formed under said first assist gate and said second assist gate.

4. The non-volatile semiconductor memory device according to claim 3, wherein
   said insulating film formed under said connection portion has a thickness in a range from at least 13 nm to at most 33 nm.

5. The non-volatile semiconductor memory device according to claim 3, further comprising a contact portion formed on said second assist gate and configured to apply a voltage to said second assist gate, wherein
   said insulating film having a larger thickness extends from an area under said connection portion toward an area under said contact portion.

6. The non-volatile semiconductor memory device according to claim 5, wherein
   an end portion of said impurity region on a side of said memory cell is arranged closer to said memory cell relative to an end portion on the side of said memory cell, of a large-thickness portion of said insulating film extending from said connection portion toward the area under said contact portion.

7. The non-volatile semiconductor memory device according to claim 5, wherein
said insulating film formed from the area under said connection portion toward the area under said contact portion has a thickness in a range from at least 13 nm to at most 33 nm.

8. The non-volatile semiconductor memory device according to claim 1, wherein
a voltage applied to said first assist gate is higher than a voltage applied to said second assist gate.

* * * * *